US012683274B2

(12) United States Patent
    Sun et al.

(10) Patent No.:   US 12,683,274 B2
(45) Date of Patent:       Jul. 14, 2026

(54) ANTENNA STRUCTURE AND ELECTRONIC DEVICE

(71) Applicant: Wistron NeWeb Corporation, Hsinchu (TW)

(72) Inventors: Tzu-Kuan Sun, Hsinchu (TW); Hong-Jun Jian, Hsinchu (TW); Hsiang-Chao Liu, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 168 days.

(21) Appl. No.: 18/507,188

(22) Filed: Nov. 13, 2023

(65) Prior Publication Data

US 2025/0105500 A1      Mar. 27, 2025

(30) Foreign Application Priority Data

Sep. 23, 2023    (TW) .................................. 112136424

(51) Int. Cl.
    *H01Q 1/44*          (2006.01)
    *H05K 7/20*          (2006.01)
(52) U.S. Cl.
    CPC ........... *H01Q 1/44* (2013.01); *H05K 7/20336* (2013.01); *H05K 7/2039* (2013.01)

(58) Field of Classification Search
    None
    See application file for complete search history.

(56) References Cited

U.S. PATENT DOCUMENTS

| | | | |
|---|---|---|---|
| 11,778,784 B2 | 10/2023 | Pu et al. | |
| 2021/0175596 A1* | 6/2021 | Migliorino | ............... H01Q 1/02 |
| 2021/0359389 A1 | 11/2021 | Wang | |
| 2023/0126145 A1 | 4/2023 | Greaney | |

FOREIGN PATENT DOCUMENTS

| | | | | |
|---|---|---|---|---|
| CN | 101641002 A | * | 2/2010 | ......... H01L 23/3672 |
| TW | 202239306 A | | 10/2022 | |

* cited by examiner

*Primary Examiner* — Crystal L Hammond
(74) *Attorney, Agent, or Firm* — McClure, Qualey & Rodack, LLP

(57)                ABSTRACT

An antenna structure includes a heatsink and a feeding source. The heatsink includes a plurality of cooling fins and a metal connecting portion. The cooling fins are spaced apart from each other and have a same fin length. The metal connecting portion is connected to one end of each of the cooling fins. The feeding source is disposed on one side of the cooling fins and is signally connected to the heatsink by one of a direct feed type and a coupled feed type.

8 Claims, 8 Drawing Sheets

100

ANTENNA STRUCTURE AND ELECTRONIC DEVICE

RELATED APPLICATIONS

This application claims the benefit of priority to Taiwan Patent Application No. 112136424, filed on Sep. 23, 2023. The entire content of the above identified application is incorporated herein by reference.

BACKGROUND

Technical Field

The present disclosure relates to an antenna structure and an electronic device, in particular to an antenna structure and an electronic device utilizing cooling fins as a radiating body.

Description of Related Art

With the advancement of computer technology, laptops are becoming smaller, and narrow bezel screens are becoming a trend. It is becoming more challenging to install antennas at the edges of the screens (at panel side of AB part). Therefore, conventional techniques involve placing the antennas on two adjacent sides of the laptop's cooling fan. However, these conventional techniques require a larger clearance area and often result in interference between the antennas and the cooling device. Currently, there is a lack of antenna structures and electronic devices in the market that occupy minimal space, enhance coupling efficiency, and cater to multiple frequency bands. Consequently, industry professionals are actively seeking solutions to address these challenges.

SUMMARY

One embodiment of the structural configuration according to the present disclosure provides an antenna structure including a heatsink and a feeding source. The heatsink includes a plurality of cooling fins and a metal connecting portion. The cooling fins are spaced apart from each other and have a same fin length. The metal connecting portion is connected to one end of each of the cooling fins. The feeding source is disposed on one side of the cooling fins, and is signally connected to the heatsink by a direct feed type.

Another embodiment of the structural configuration according to the present disclosure provides an antenna structure including a heatsink, a feeding source, and an antenna unit. The heatsink includes a plurality of cooling fins and a metal connecting portion. The cooling fins are spaced apart from each other and have a same fin length. The metal connecting portion is connected to one end of each of the cooling fins. The feeding source is disposed on one side of the cooling fins. The antenna unit is connected to at least one of the cooling fins and the feeding source. The feeding source is signally connected to the heatsink by a coupled feed type.

Yet another embodiment of the structural configuration according to the present disclosure provides an electronic device including a shell and an antenna structure. The antenna structure is disposed in the shell and includes a heatsink and a feeding source. The heatsink includes a plurality of cooling fins and a metal connecting portion. The cooling fins are spaced apart from each other and have a same fin length. The metal connecting portion is connected to one end of each of the cooling fins. The feeding source is disposed on one side of the cooling fins, and is signally connected to the heatsink by one of a direct feed type and a coupled feed type.

BRIEF DESCRIPTION OF THE DRAWINGS

The described embodiments may be better understood by reference to the following description and the accompanying drawings, in which.

DETAILED DESCRIPTION

Figure 2:
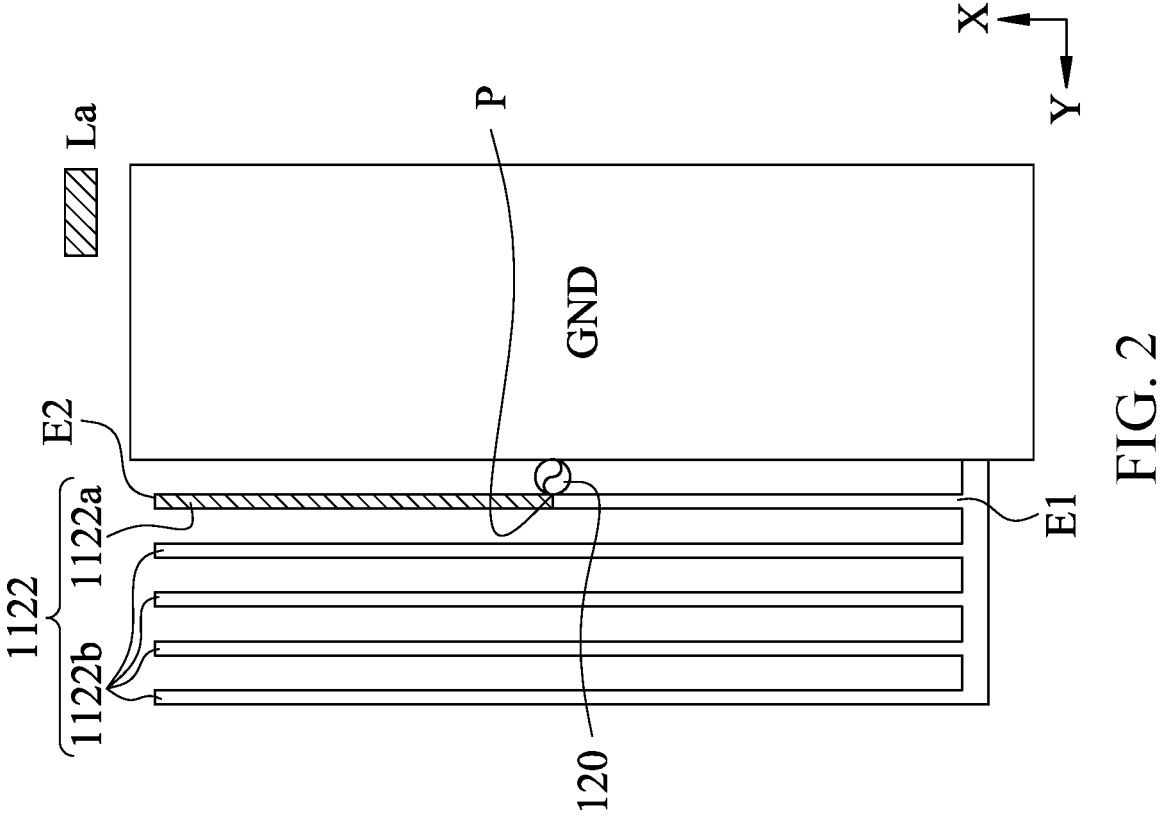
FIG. 2 is an equivalent schematic view of the antenna structure as shown in FIG. 1.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like. The term "roughly" or "about" refers to the ability of a person having ordinary skilled in the art to address the technical issues within an acceptable range of error and achieve the fundamental technical effect.

Figure 1:
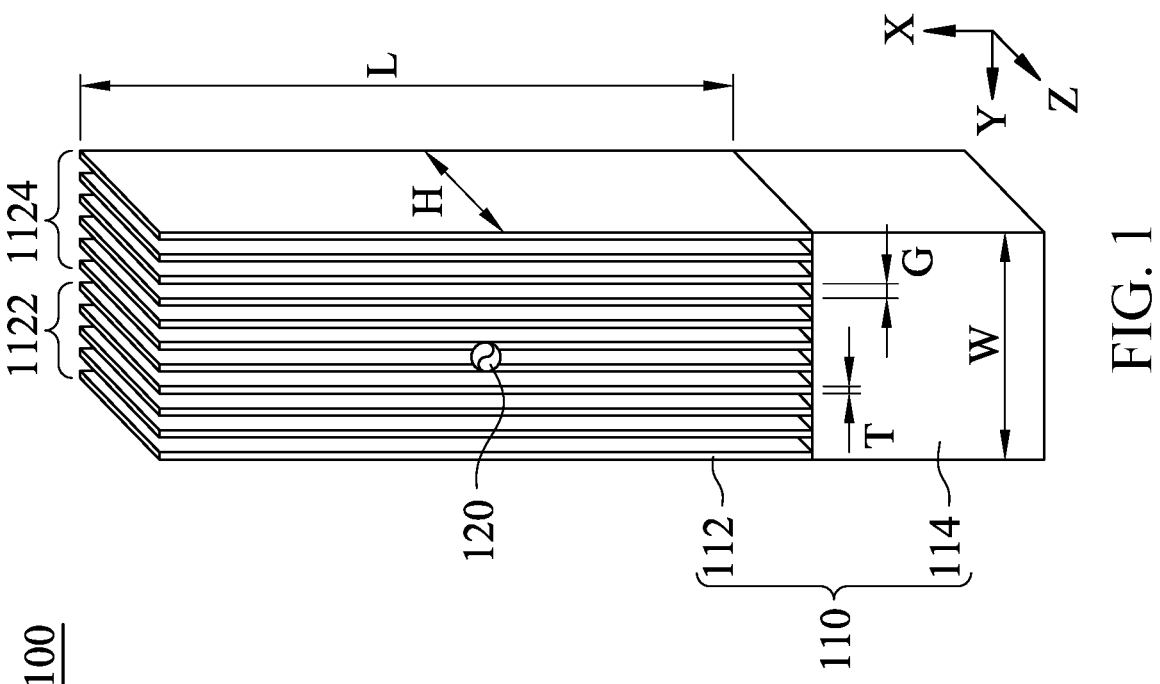
FIG. 1 is a schematic view of an antenna structure according to a first embodiment of the present disclosure.

Referring to FIG. 1. FIG. 1 is a schematic view of an antenna structure 100 according to a first embodiment of the present disclosure. The antenna structure 100 includes a heatsink 110 and a feeding source 120. The heatsink 110 includes a plurality of cooling fins 112 and a metal connecting portion 114. The cooling fins 112 are spaced apart from each other and have a same fin length L (along X-axis). The metal connecting portion 114 is connected to one end of each of the cooling fins 112. The feeding source 120 is disposed on one side of the cooling fins 112, and is signally connected to the heatsink 110 by a direct feed type.

Specifically, the cooling fins 112 have the same structure and are arranged in parallel. The cooling fins 112 are vertically connected to the metal connecting portion 114. The direct feed type is that the feeding source 120 is signally connected between two of the cooling fins 112. The feeding source 120 includes a feeding terminal (positive terminal) and a ground terminal (negative terminal). The feeding terminal is connected to one of the two of the cooling fins 112, and the ground terminal is at least connected to another one of the two of the cooling fins 112.

In the present embodiment, each of the cooling fins 112 has a fin thickness T (along Y-axis). The fin thickness T is greater than or equal to 0.1 mm and smaller than or equal to 1 mm. A fin interval G (along Y-axis) is between adjacent two of the cooling fins 112. The fin interval G is greater than or equal to 1 mm and smaller than or equal to 10 mm. Furthermore, the cooling fins 112 further have a total fin width W (along Y-axis) and a same fin height H (along Z-axis). The fin length L is greater than or equal to 20 mm and smaller than or equal to 50 mm. The total fin width W is greater than or equal to 5 mm and smaller than or equal to 50 mm. The fin height H is greater than or equal to 3 mm and smaller than or equal to 30 mm, but the present disclosure is not limited thereto.

Referring to FIG. 1 and FIG. 2. FIG. 2 is an equivalent schematic view of the antenna structure 100 as shown in FIG. 1. The cooling fins 112 of the antenna structure 100 are divided into multiple first fins 1122 and multiple second fins 1124 according to the feeding source 120. One of the first fins 1122 (i.e., a first fin 1122a) has a first end E1, a second end E2, and a feeding connecting point P. The first end E1 is connected to the metal connecting portion 114 and is opposite to the second end E2. The feeding connecting point P is between the first end E1 and the second end E2 and is connected to the feeding source 120. The first fin 1122a is configured to generate a high frequency mode. A feeding branch La is formed between the feeding connecting point P and the second end E2. A remaining part (i.e., four first fins 1122b) of the first fins 1122 is separated from the feeding source 120, and is configured to generate a low frequency mode. Each of the first fins 1122b can be regarded as a coupled arm. In addition, at least one of the second fins 1124 is connected to a ground potential GND. In other words, a ground end of the feeding source 120 can be connected to all or part of the second fins 1124. In this way, the present disclosure can form a coupled type antenna with multiple coupled arms through the first fins 1122 and the grounded second fins 1124. In addition, the present disclosure can adjust low-frequency impedance matching and contribute to part of the high frequency mode by changing the fin height H, achieving a mode of operation similar to a patch antenna.

Figure 3:
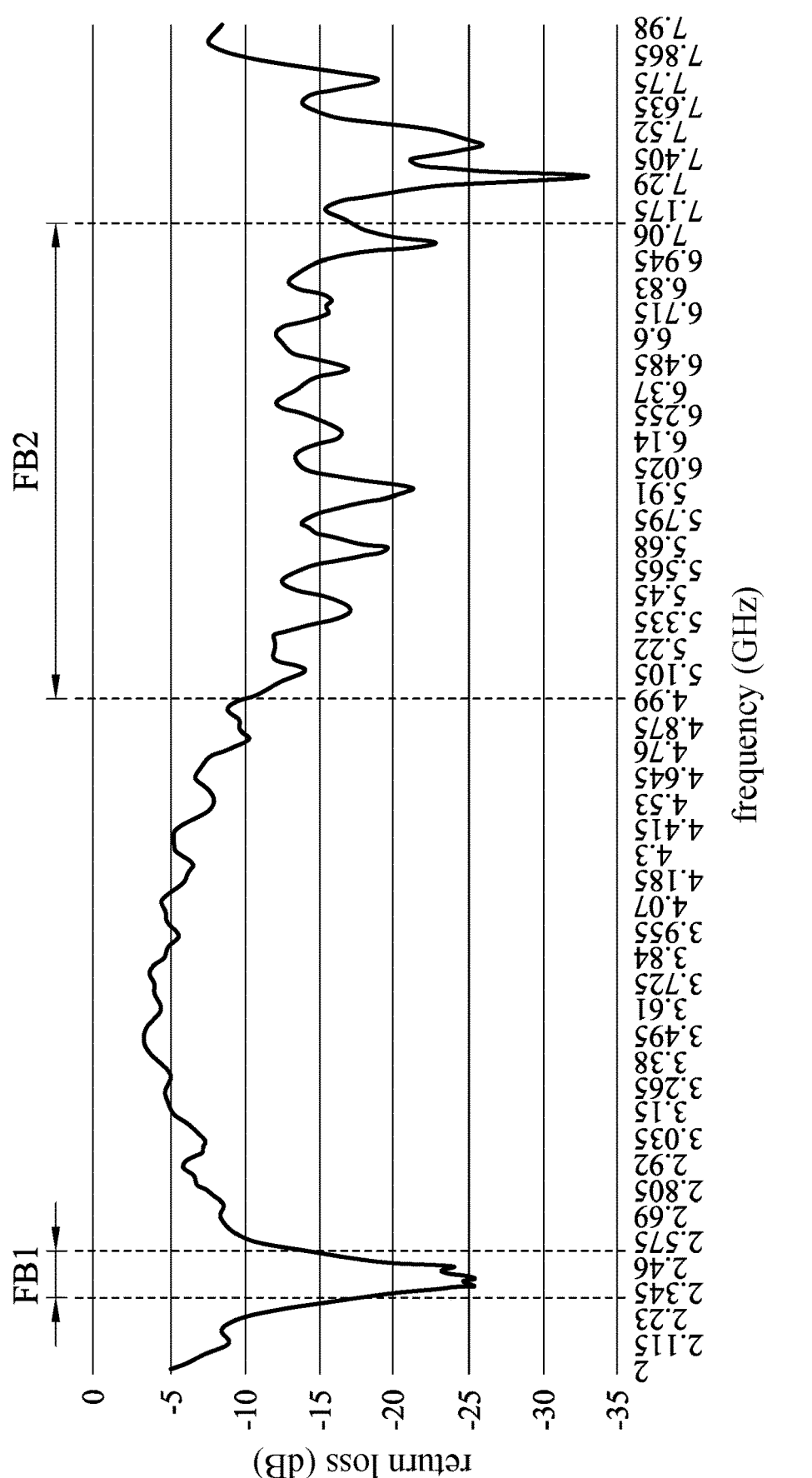
FIG. 3 is a schematic diagram of a return loss curve of the antenna structure as shown in FIG. 1.

Referring to FIG. 1 and FIG. 3. FIG. 3 is a schematic diagram of a return loss (S-parameter) curve of the antenna structure 100 as shown in FIG. 1. The return loss curve is the return loss values (dB) corresponding to various frequencies (GHz) for the antenna structure 100. The antenna structure 100 is operated in wireless local area network (WLAN) frequency bands. The WLAN frequency bands include a first frequency band FB1 and a second frequency band FB2. The first frequency band FB1 is between 2.4 GHz and 2.5 GHZ. The second frequency band FB2 is between 5 GHz and 7.125 GHz. In other words, the return loss values of the antenna structure 100 in the WLAN frequency bands comply with the specifications. In this way, the antenna structure 100 of the present disclosure utilizes the cooling fins 112 as a radiating body and contributes radiation in different frequency bands through direct feeding, which can reduce antenna size, improve coupling efficiency, and cover the WLAN frequency bands.

Figure 4:
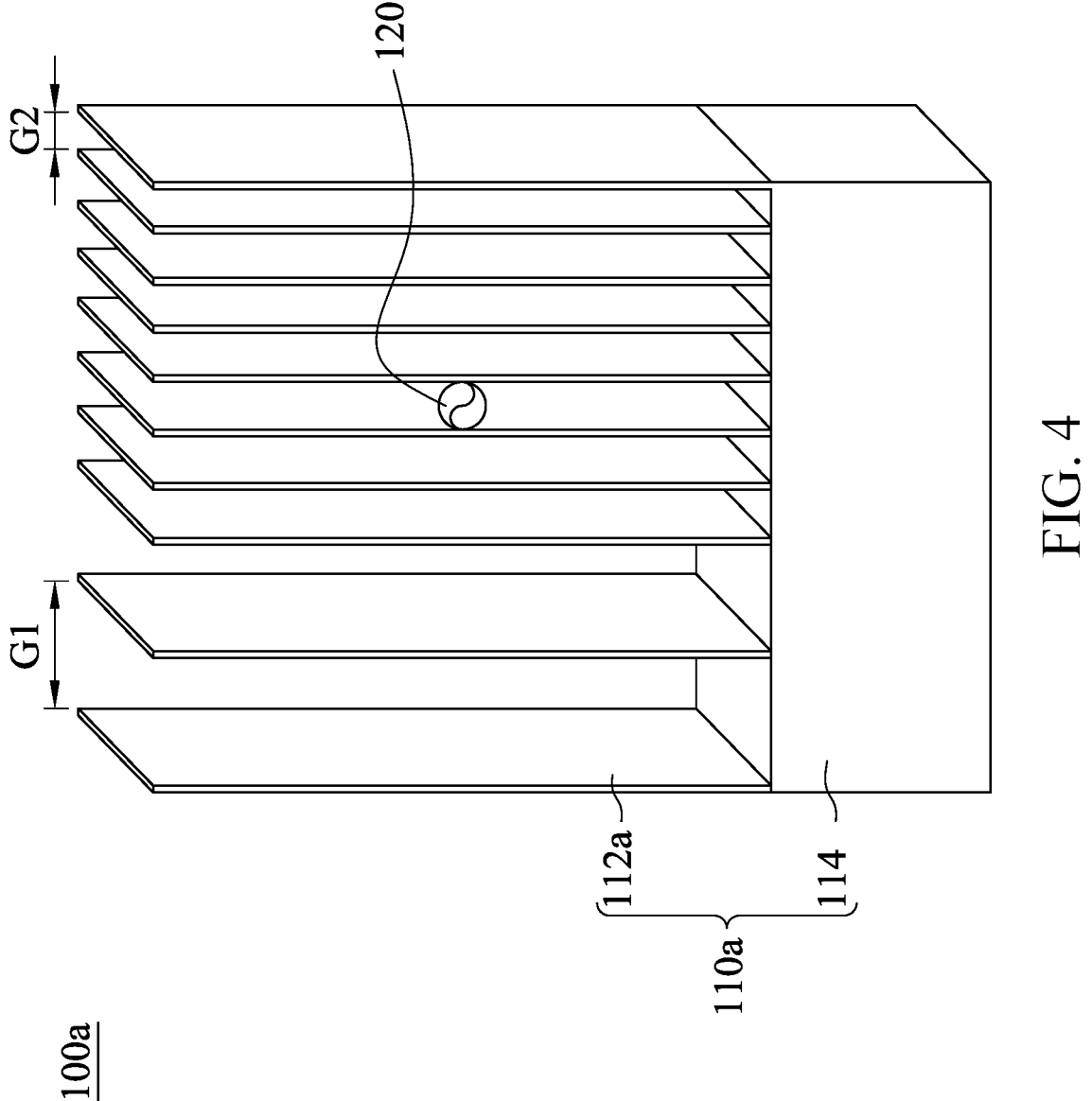
FIG. 4 is a schematic view of an antenna structure according to a second embodiment of the present disclosure.

Referring to FIG. 1 and FIG. 4. FIG. 4 is a schematic view of an antenna structure 100a according to a second embodiment of the present disclosure. The antenna structure 100a includes a heatsink 110a and a feeding source 120. The heatsink 110a includes multiple cooling fins 112a and a metal connecting portion 114. The cooling fins 112a are divided into multiple first fins and multiple second fins according to the feeding source 120. A first fin interval G1 is between two adjacent first fins. A second interval G2 is between two adjacent second fins. The first fin interval G1 is different from the second fin interval G2. In the present embodiment, the first fin interval G1 is greater than the second fin interval G2. The antenna structure 100a in FIG. 4 is a variation of the antenna structure 100 in FIG. 1. In this way, the antenna structure 100a of the present disclosure can vary the frequency bands contributed by each coupled arm by adjusting the fin interval within a limited space. This not only enhances the operational bandwidth but also allows for independent control of the coupling effects of each coupled arm in order to conform efficiency for different frequency bands, thereby covering the WLAN frequency bands.

Figure 5A:
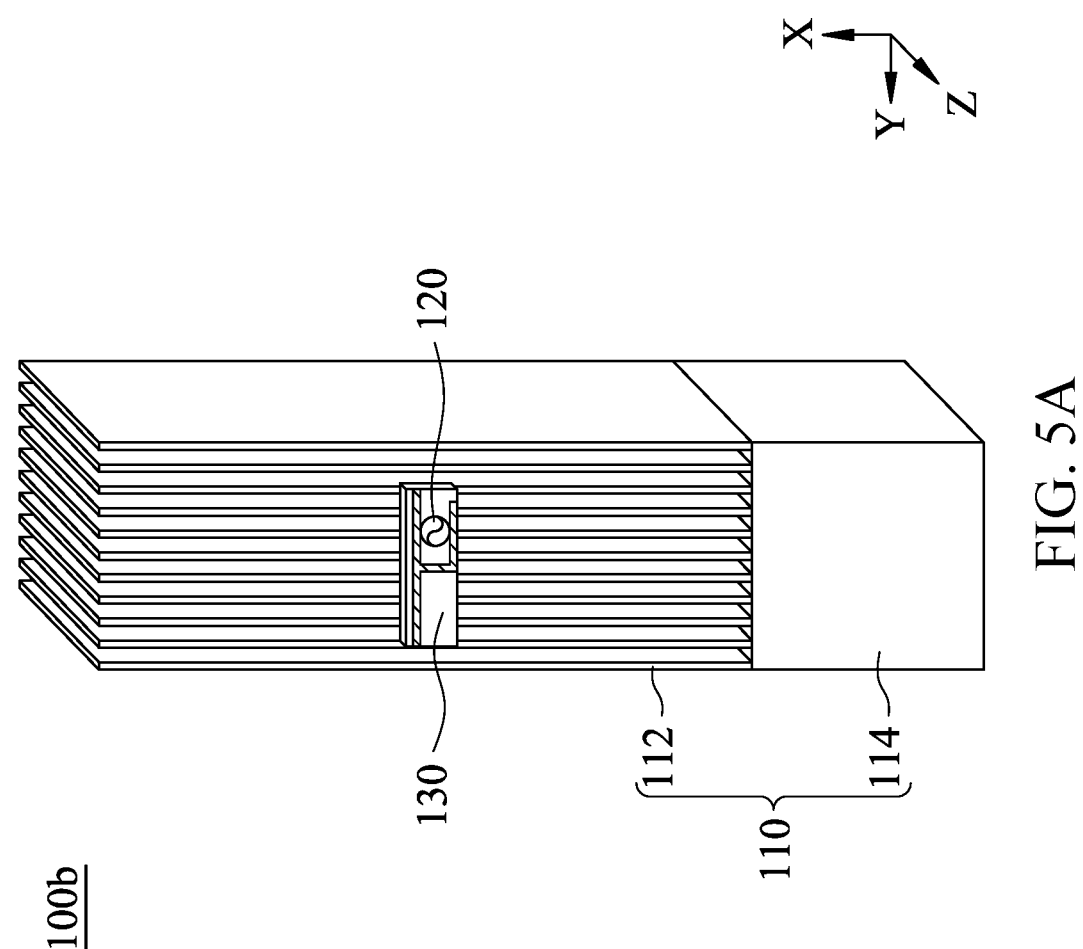
FIG. 5A is a schematic view of an antenna structure according to a third embodiment of the present disclosure.
Figure 5C:
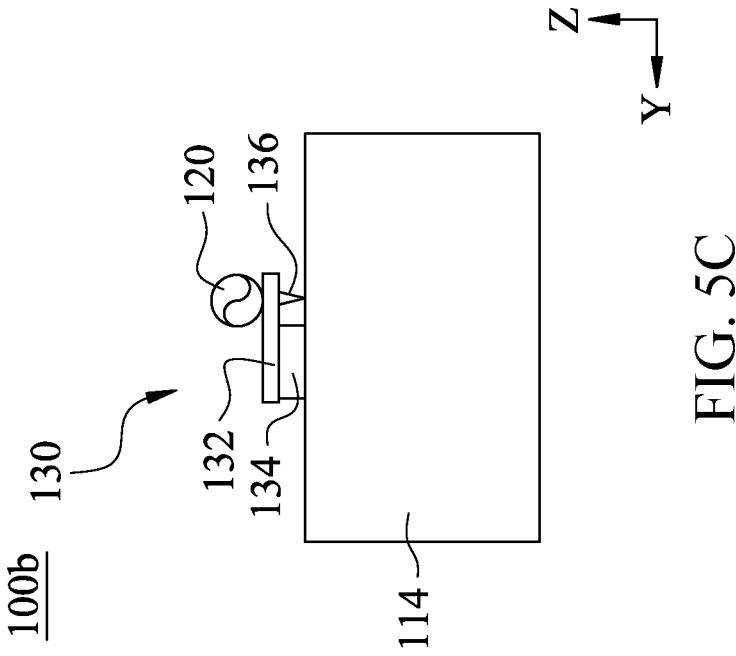
FIG. 5C is another schematic side view of the antenna structure as shown in FIG. 5A.
Figure 5B:
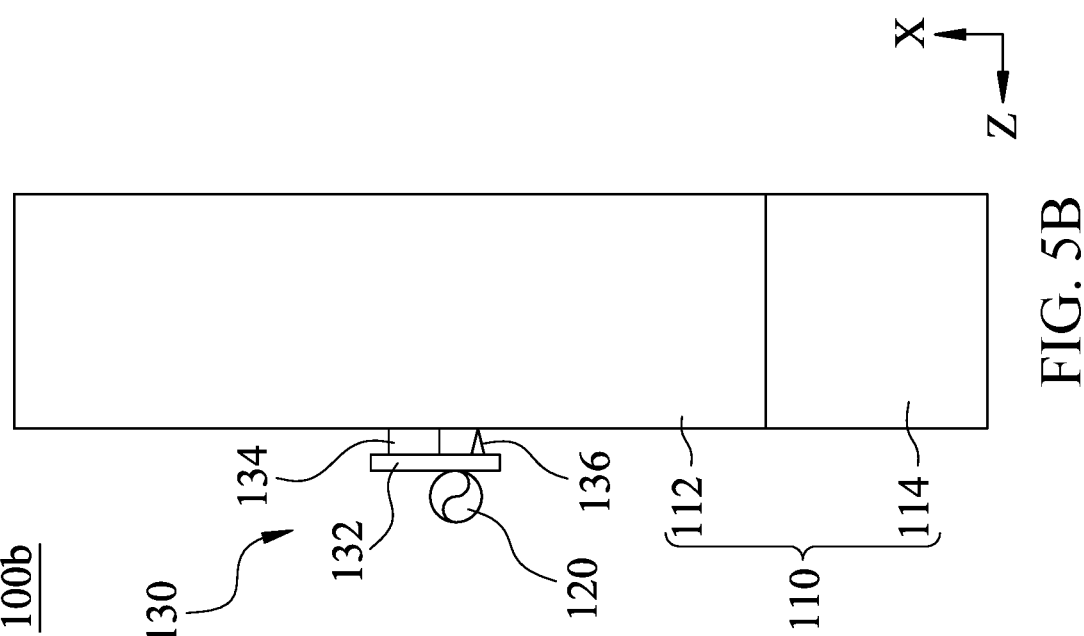
FIG. 5B is a schematic side view of the antenna structure as shown in FIG. 5A.

Referring to FIG. 1, FIG. 5A, FIG. 5B, and FIG. 5C. FIG. 5A is a schematic view of an antenna structure 100b according to a third embodiment of the present disclosure. FIG. 5B is a schematic side view of the antenna structure 100b as shown in FIG. 5A. FIG. 5C is another schematic side view of the antenna structure 100b as shown in FIG. 5A. The antenna structure 100b includes a heatsink 110, a feeding source 120, and an antenna unit 130. Structures of the heatsink 110 and the feeding source 120 are respectively the same as structures of the heatsink 110 and the feeding source 120 in FIG. 1, and will not be repeated herein. The antenna unit 130 is connected to at least one of the cooling fins 112 and the feeding source 120. The feeding source 120 is connected to the heatsink 110 by a coupled feed type.

Specifically, the coupled feed type is that the feeding source 120 is signally connected to the heatsink 110 through the antenna unit 130. The antenna unit 130 includes a coupled feed type antenna 132, an insulator 134, and a connector 136. The coupled feed type antenna 132 is connected to the feeding source 120. The insulator 134 is connected between the coupled feed type antenna 132 and at least one of the cooling fins 112. The feeding source 120 is signally connected to the cooling fins 112 through the coupled feed type antenna 132. The connector 136 is connected between the coupled feed type antenna 132 and at least another one of the cooling fins 112.

In the present embodiment, the coupled feed type antenna 132 is a planar inverted F antenna (PIFA) configured to generate a high frequency mode. The insulator 134 is a sponge in which the thickness thereof may be greater than or equal to 2 mm and smaller than or equal to 5 mm. The connector 136 can be a pogo pin, but the present disclosure is not limited thereto. In other embodiments, the coupled feed type antenna 132 can be a monopole antenna or a loop antenna.

Figure 6B:
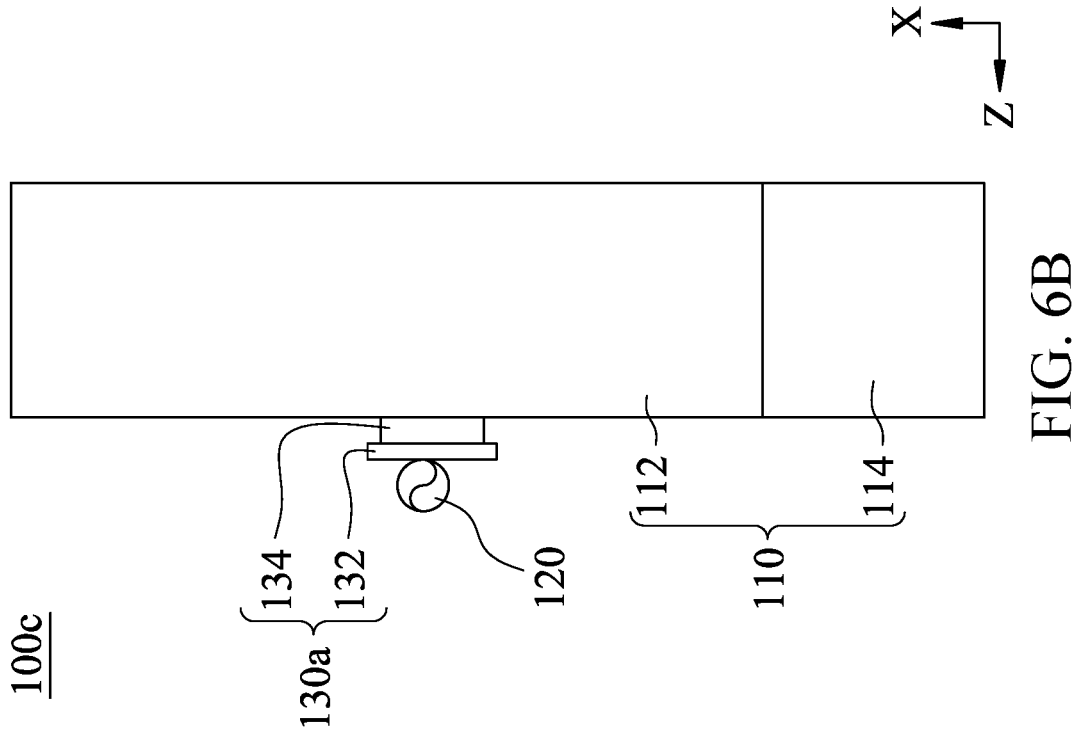
FIG. 6B is a schematic side view of the antenna structure as shown in FIG. 6A.
Figure 6A:
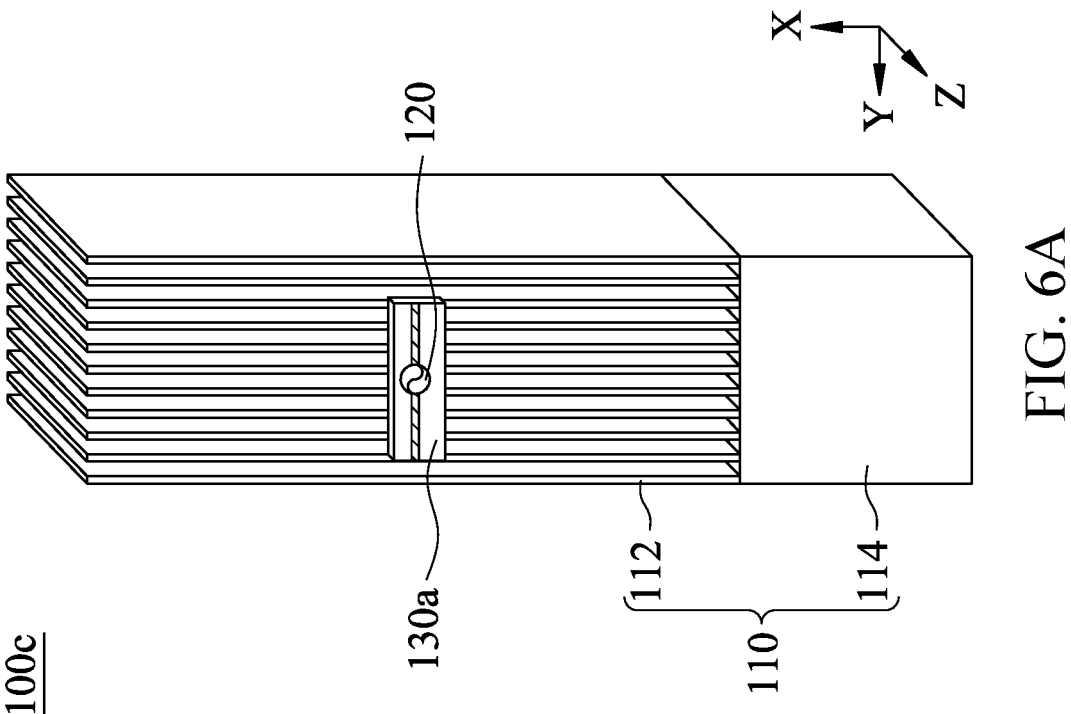
FIG. 6A is a schematic view of an antenna structure according to a fourth embodiment of the present disclosure.

Referring to FIG. 5B, FIG. 6A, and FIG. 6B. FIG. 6A is a schematic view of an antenna structure 100c according to a fourth embodiment of the present disclosure. FIG. 6B is a schematic side view of the antenna structure 100c as shown in FIG. 6A. The antenna structure 100c includes a heatsink 110, a feeding source 120, and an antenna unit 130a. Structures of the heatsink 110 and the feeding source 120 are respectively the same as structures of the heatsink 110 and the feeding source 120 as shown in FIG. 5B, and will not be repeated herein. Differences between the antenna unit 130a and the antenna unit 130 is that the antenna unit 130a only includes a coupled feed type antenna 132 and an insulator 134, without including a connector. The coupled feed type antenna 132 is a dipole antenna.

It is also worth mentioning that the heatsink 110 of the antenna structures 100b, 100c mentioned above can be replaced with the heatsink 110a of the antenna structure 100a as shown in FIG. 4, so that the antenna structures 100b, 100c can also vary the frequency bands contributed by each coupled arm and the coupling effects by adjusting the fin interval. In this way, the antenna structures 100b, 100c of the present disclosure utilize the cooling fins 112 as a radiating body and contribute radiation in different frequency bands through coupled feeding, enabling a reduction in antenna size, improving coupling efficiency, and covering the WLAN frequency bands.

Figure 7:
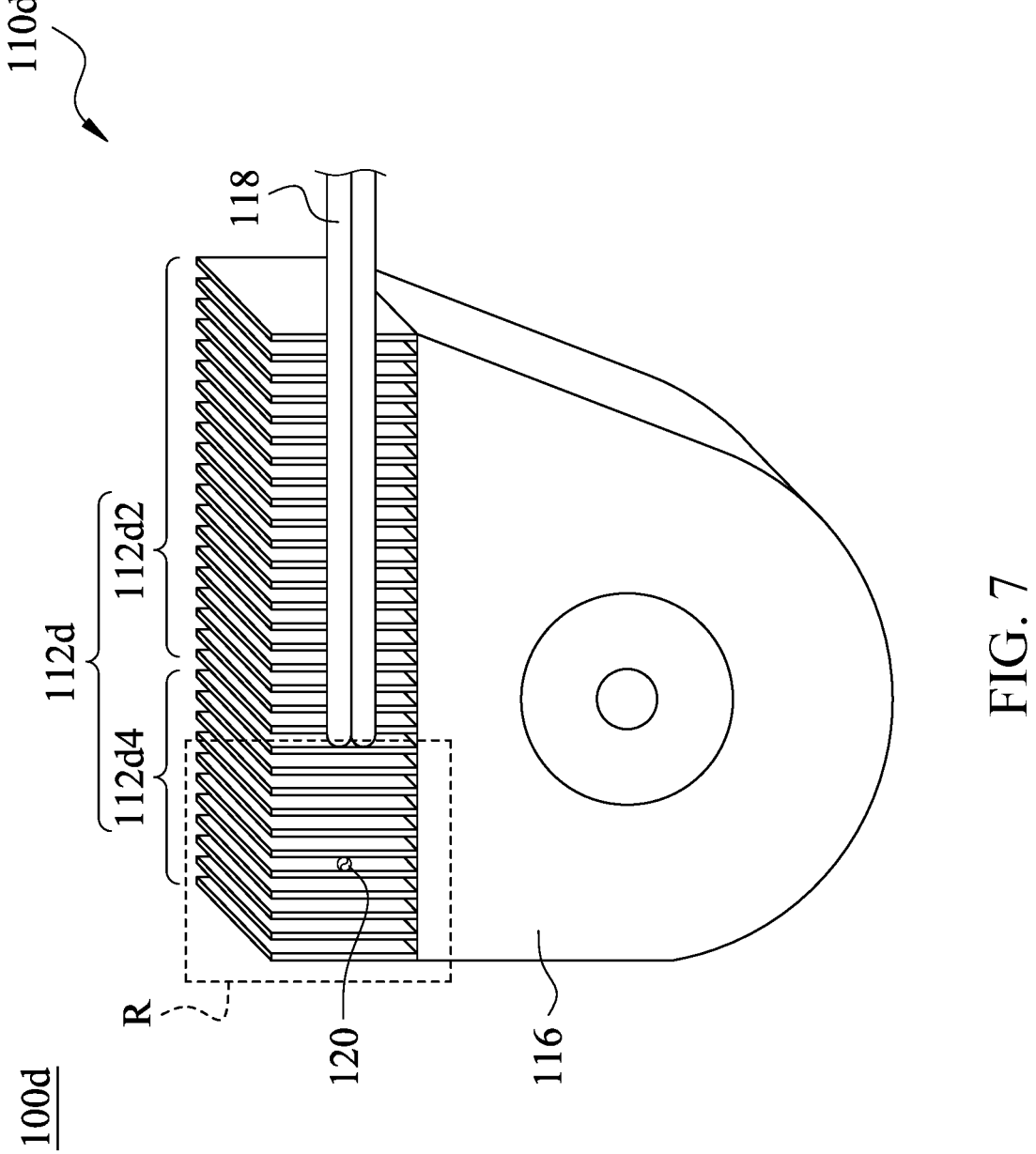
FIG. 7 is a schematic view of an antenna structure according to a fifth embodiment of the present disclosure.

Referring to FIG. 1 and FIG. 7. FIG. 7 is a schematic view of an antenna structure 100d according to a fifth embodiment of the present disclosure. A structure of a region R of the antenna structure 100d corresponds to the antenna structure 100 as shown in FIG. 1. The antenna structure 100d includes a heatsink 110d and a feeding source 120. The heatsink 110d includes multiple cooling fins 112d, a fan 116, and a heat pipe 118. The fan 116 includes a metal connecting portion 114. In other words, the metal connecting portion 114 is a part of the fan 116, and is connected to the cooling fins 112d. The heat pipe 118 is connected to a part (i.e., cooling fins 112d2) of the cooling fins 112d, and is separated from the feeding source 120. The fan 116 and the heat pipe 118 are configured to dissipate heat of the cooling fins 112d. Another part (i.e., cooling fins 112d4) of the cooling fins 112d has a total fin width W. In addition, the fan 116 is made of a metal material. The cooling fins 112d joint the fan 116, making the fan 116 become a ground part of a radiation device, thereby integrating the environment to achieve an improved impedance matching. The heat pipe 118 is on right side of the region R, with no obstructions on left side of the region R to prevent interference. The heat pipe 118 can also be made of a metal material and is retreated based on the total fin width W of the fins, which can be regarded as the ground part of the radiation device. In addition, in other embodiments, the structure in the region R of the antenna structure 100d can be replaced with other forms (e.g., the antenna structure 100a in FIG. 4, the antenna structure 100b in FIG. 5A, or the antenna structure 100c in FIG. 6A), and the present disclosure is not limited thereto.

Figure 8:
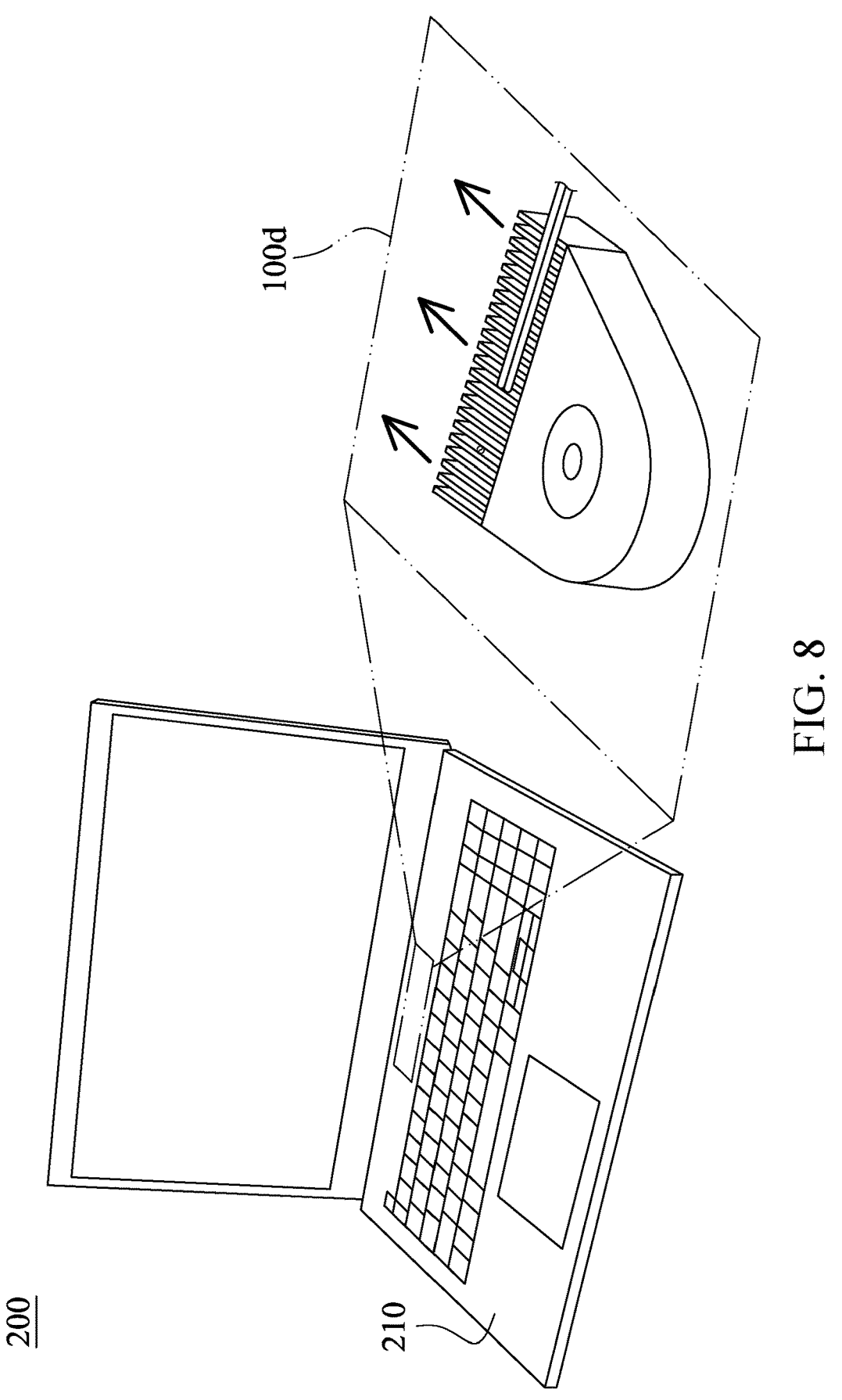
FIG. 8 is a schematic view of an electronic device according to a sixth embodiment of the present disclosure.

Referring to FIG. 7 and FIG. 8. FIG. 8 is a schematic view of an electronic device 200 according to a sixth embodiment of the present disclosure. The electronic device 200 includes a shell 210 and an antenna structure 100d. The antenna structure 100d is disposed in the shell 210 (e.g., close to AB part in the shell 210). The dissipation path involves the intake of external air by the fan 116, followed by its exhaust from above the cooling fins 112d. In the present embodiment, the electronic device 200 is a notebook, but the present disclosure is not limited thereto.

According to the above embodiments, the present disclosure has the following advantages. Firstly, by using cooling fins as a radiating body and contributing radiation in different frequency bands through direct or coupled feeding, the present disclosure can reduce antenna size, improve coupling efficiency, and cover the WLAN frequency bands. Secondly, within a limited space, the antenna structure can vary the frequency bands contributed by each coupled arm by adjusting the fin interval. This not only enhances the operational bandwidth but also allows independent control of the coupling effects of each coupled arm to conform efficiency for different frequency bands.

The foregoing description of the disclosure has been presented only for the purposes of illustration and description option of the exemplary embodiments and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An antenna structure, comprising:
   a heatsink, comprising:
      a plurality of cooling fins spaced apart from each other and having a same fin length; and
      a metal connecting portion connected to one end of each of the cooling fins; and
   a feeding source disposed on one side of the cooling fins, and directly connected to the heatsink by a direct feed type;
   wherein the direct feed type is that the feeding source is directly connected between two of the cooling fins.

2. The antenna structure according to claim 1, wherein the cooling fins have a same structure and are arranged in parallel, the cooling fins are vertically connected to the metal connecting portion.

3. The antenna structure according to claim 1, wherein,
   each of the cooling fins has a fin thickness, and the fin thickness is greater than or equal to 0.1 mm and smaller than or equal to 1 mm; and
   a fin interval is between adjacent two of the cooling fins, and the fin interval is greater than or equal to 1 mm and smaller than or equal to 10 mm.

4. The antenna structure according to claim 1, wherein the cooling fins further have a total fin width and a same fin height, the same fin length is greater than or equal to 20 mm and smaller than or equal to 50 mm, the total fin width is greater than or equal to 5 mm and smaller than or equal to 50 mm, and the same fin height is greater than or equal to 3 mm and smaller than or equal to 30 mm.

5. The antenna structure according to claim 4, wherein the heatsink further comprises:
   a fan comprising the metal connecting portion and connected to the cooling fins; and
   a heat pipe connected to a part of the cooling fins, and separated from the feeding source;

wherein the fan and the heat pipe are configured to dissipate heat of the cooling fins, and another part of the cooling fins has the total fin width.

6. The antenna structure according to claim 1, wherein the cooling fins are divided into a plurality of first fins and a plurality of second fins according to the feeding source;

wherein one of the first fins has a first end, a second end, and a feeding connecting point, the first end is connected to the metal connecting portion and is opposite to the second end, the feeding connecting point is between the first end and the second end and is connected to the feeding source, the one of the first fins is configured to generate a high frequency mode, a feeding branch is formed between the feeding connecting point and the second end, a remaining part of the first fins is separated from the feeding source, and is configured to generate a low frequency mode;

wherein at least one of the second fins is connected to a ground potential.

7. The antenna structure according to claim 6, wherein a first fin interval is between adjacent two of the first fins, a second fin interval is between adjacent two of the second fins, and the first fin interval is different from the second fin interval.

8. The antenna structure according to claim 1, wherein the antenna structure is operated in wireless local area network (WLAN) frequency bands, the WLAN frequency bands comprise a first frequency band and a second frequency band, the first frequency band is between 2.4 GHz and 2.5 GHZ, and the second frequency band is between 5 GHz and 7.125 GHz.

* * * * *